(12) United States Patent
Grewing et al.

(10) Patent No.: US 7,573,342 B2
(45) Date of Patent: Aug. 11, 2009

(54) VCO PRE-COMPENSATION

(75) Inventors: Christian Grewing, Sollentuna (SE);
Stefan Heinrich van Waasen,
Kolbermoor (DE); Emericks Anders,
Solna (SE)

(73) Assignee: Infineon Technologies AG, Neubiberg (DE)

( * ) Notice: Subject to any disclaimer, the term of this patent is extended or adjusted under 35 U.S.C. 154(b) by 86 days.

(21) Appl. No.: 11/781,145

(22) Filed: Jul. 20, 2007

(65) Prior Publication Data

US 2009/0021311 A1    Jan. 22, 2009

(51) Int. Cl.
*H03B 1/00* (2006.01)

(52) U.S. Cl. ............... 331/74; 331/117 R; 331/117 FE; 331/167; 331/177 V

(58) Field of Classification Search ............. 331/116 R, 331/158, 74, 117 FE, 167, 117 R
See application file for complete search history.

(56) References Cited

U.S. PATENT DOCUMENTS 7,123,113 B1 * 10/2006 Brennan et al. ............. 331/158

* cited by examiner

*Primary Examiner*—Arnold Kinkead
(74) *Attorney, Agent, or Firm*—Lee & Hayes, PLLC

(57) ABSTRACT

A VCO device is described that has pre-compensation. Digitally switchable compensation capacitors are selectively activated to adjust operation of the VCO to mitigate undesirable operational effects. In some example embodiments, the digitally switchable compensation capacitors of the VCO are adjusted to compensate for the effects of activating (from a quiescent state) an output buffer driven by the VCO.

19 Claims, 4 Drawing Sheets

VCO PRE-COMPENSATION

BACKGROUND

Frequency synthesizers are commonly used in integrated communication systems to provide a carrier frequency. The frequency synthesizers are typically implemented as Voltage Controlled Oscillators (VCOs) using a Phase-Lock Loop (PLL) circuit to stabilize the frequency source and minimize phase noise. An output buffer is often used to amplify the output of the frequency synthesizer and to isolate the frequency synthesizer from load conditions. In portable systems such as cellular telephones, the VCO and the output buffer can be switched on and off to conserve power.

BRIEF DESCRIPTION OF THE DRAWINGS

Non-limiting and non-exhaustive embodiments of the present disclosure are described with reference to the following drawings.

DETAILED DESCRIPTION

Figure 1:
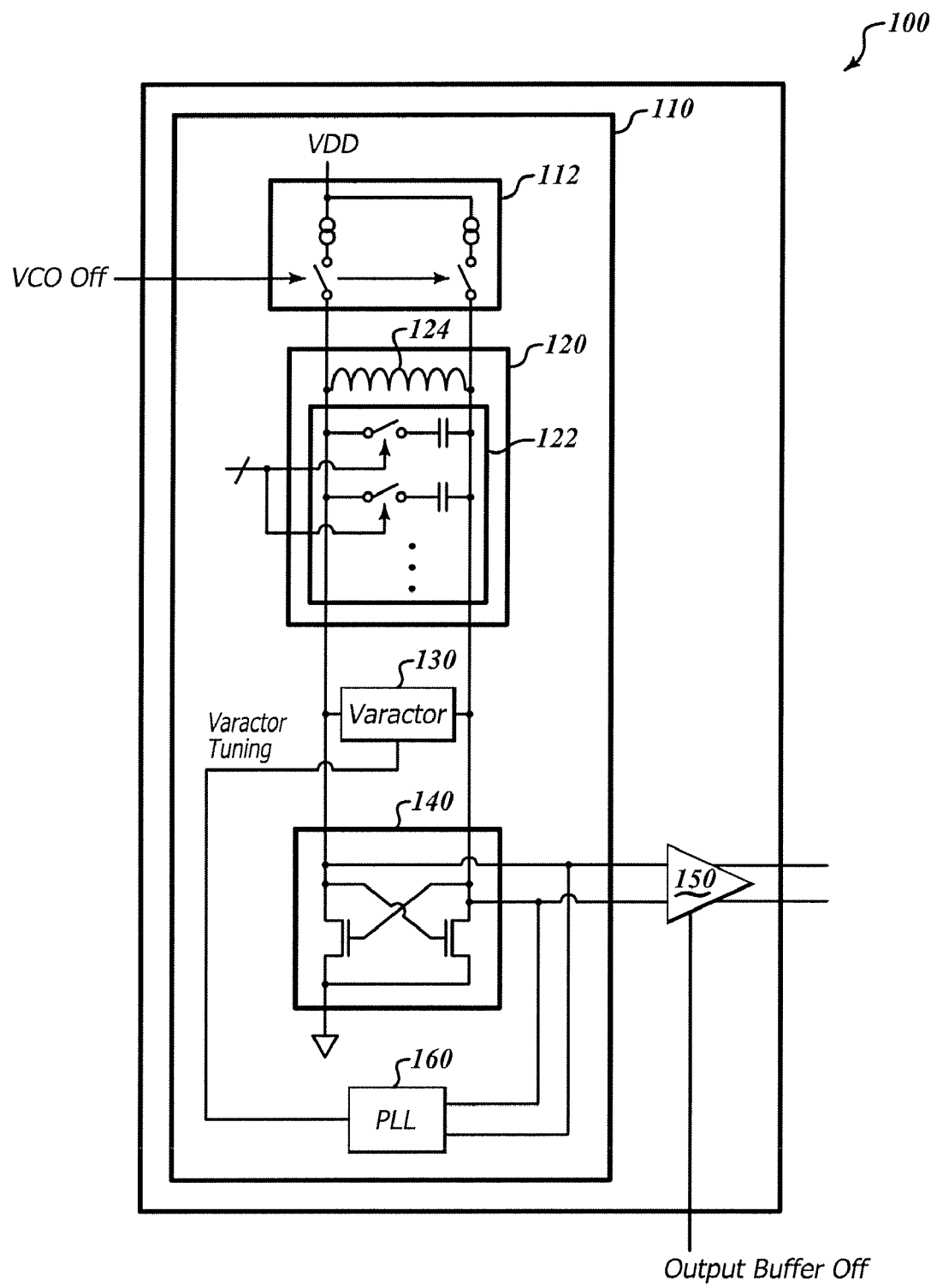
FIG. 1 is a schematic diagram that illustrates a conventional Voltage Controlled Oscillator device.

Various embodiments of the present disclosure will be described in detail with reference to the drawings, where like reference numerals represent like parts and assemblies throughout the several views. In the figures, the left-most digit(s) of a reference number identifies the figure in which the reference number first appears. The use of the same reference numbers in different figures indicates similar or identical items. Reference to various embodiments does not limit the scope of the disclosure, which is limited only by the scope of the claims attached hereto. Additionally, examples set forth in this specification are not intended to be limiting and merely set forth some of the many possible embodiments contemplated in the present disclosure.

Briefly stated, the present disclosure is generally related to an improved VCO device having pre-compensation, where digitally switchable compensation capacitors are selectively activated to adjust operation of the VCO to mitigate undesirable operational effects. In some example embodiments, the digitally switchable compensation capacitors of the VCO are adjusted to compensate for the effects of activating (from a quiescent state) an output buffer driven by the VCO.

When the output buffer for a VCO is activated or switched on, various undesirable effects can lengthen the transient time for the feedback loop to stabilize the frequency of the VCO. In one example, the power supply voltage may change due to increased current consumption from the output buffer. In another example, the operating temperature of the overall circuit may change as a result of heat generated by the various circuits. In still another example, the load impedance seen by the VCO may change once the output buffer is activated. The direction and magnitude of these and other transient effects on the VCO frequency changes can be estimated and the values of compensation capacitors can be adjusted accordingly. By adjusting the values of the compensation capacitors, the settling time and/or stability of the VCO can be improved.

Overview

In the following, a brief discussion of a conventional Voltage Controlled Oscillator (VCO) frequency synthesizer device is provided. Subsequently, a detailed description of an improved VCO device having pre-compensation is provided. System-related and method-related details associated with the improved VCO device having pre-compensation are provided herein.

Conventional VCO used in Frequency Generation

The discussion herein concerning conventional technology and solutions is made while having knowledge of the instant disclosure and hindsight appreciation of the conventional technology. Accordingly, characterizations of conventional technology described herein do not negative patentability of the instant claims.

FIG. 1 illustrates a conventional frequency generator 100. The frequency generator 100 comprises VCO 110 and output buffer 150. VCO 110 and output buffer 150 are typically co-located on a single substrate, which increases the amount of electrical and thermal coupling between the VCO and the output buffer. Frequency generator 100 can be comprised by a communication system, such as a cellular telephone, which typically has device and/or operational limitations such as size, weight, and power consumption rate.

Both output buffer 150 and VCO 110 can be independently switched on and off for the purpose of conserving power and avoiding unwanted transmissions such as in cellular telephones. For example, signal VCO OFF can be used to power up/power down VCO 110, and signal OUTPUT BUFFER OFF can be used to power up/power down output buffer 150.

Output buffer 150 is can be a buffer (such as a power amplifier) with a differential input and a differential output (although single-ended inputs and outputs can be used). In operation, output buffer 150 is typically switched on only at the beginning of an active transmit slot (as in a cellular network). Switching the device on only at the beginning of an active transmit slot helps to reduce communications device power consumption and helps to improve the channel conditions over which the communications device using the VCO transmits.

VCO 110 comprises a switchable current source 112, a tank circuit 120, a varactor circuit 130, a cross-coupled transistor pair 140, and a phase-lock loop (PLL) 160. The switchable current source 112 selectably applies current to the tank circuit 120, the varactor circuit 130, and the cross-coupled transistor pair 140.

When current is applied, the cross-coupled transistor pair 140 provides feedback from which an oscillation frequency is established. Cross-coupled transistor pair 140 also provides amplification for the oscillating circuit to overcome losses by reactive components (such as the tank circuit 120 and the varactor circuit 130) in the circuit. The frequency of the oscillation is dependent in part upon a resonant circuit established by the combination of the reactive components in the tank circuit 120 and the varactor circuit 130.

Tank circuit 120 comprises an inductor 124 and a capacitor bank 122. Capacitor bank 122 is a digitally switchable capacitor bank that provides gross tuning control for VCO 110. A fixed capacitance in capacitor bank 122 can be selected such that the resonance of tank circuit 120 establishes a desired oscillation for VCO 110.

Varactor 130 comprises, for example, a variable capacitor that can be used for fine tuning (using signal Varactor Tuning)

the VCO. PLL 160 can be used to monitor VCO 110, and produce a control signal in response. The control signal (Varactor Tuning) is coupled to a control input of varactor 130 such that the change in the impedance of the varactor can be used to fine-tune the VCO and to enhance the frequency stability of the VCO.

The digital tuning control signals and the Varactor Tuning signals can be used together to set a frequency (alignment) of the VCO. As discussed above, the output of the VCO 110 (which drives output buffer 150) is coupled to PLL 160 which helps provide frequency stability and fine frequency tuning for VCO 110.

PLL 160 is used to drive the varactor tuning signal, and is typically designed with tolerances such that the PLL is "robust" enough to settle over a range of operating conditions. However, designing the PLL to be robust for a range of operating conditions decreases the degree to which the PLL can be optimized for other purposes. For example, wide ranged tolerances in a PLL design do not yield optimal results for reduced power consumption of the device, link budget for cell size, and the like.

EXAMPLE ARRANGEMENTS

Figure 2:
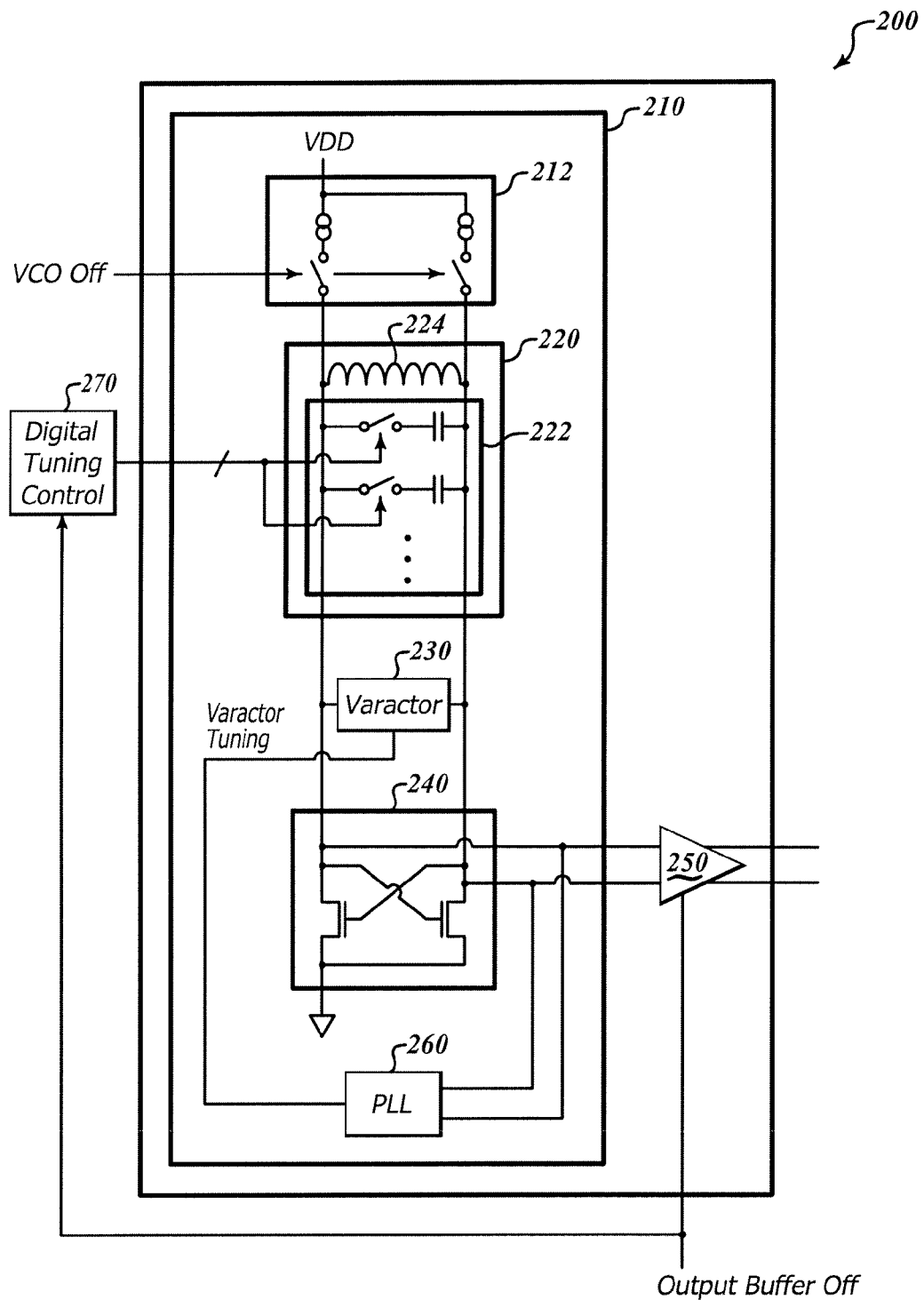
FIG. 2 is a schematic diagram illustrating an improved VCO device having pre-compensation in accordance with embodiments of the present disclosure.

FIG. 2 is a schematic diagram illustrating an improved VCO device 200 having pre-compensation in accordance with embodiments of the present disclosure. The VCO device 200 comprises VCO 210, an output buffer 250, and a digital tuning control 270. VCO 210 comprises a switchable current source 212, a tank circuit 220, a varactor circuit 230, a cross-coupled transistor pair 240, and a phase-lock loop (PLL) 260. Output buffer can be a single-ended buffer, a differential buffer, a power amplifier, or part of a power amplifier as may be desired by a designer.

Both VCO 210 and output buffer 250 can be independently enabled as needed, which saves power and minimizes unwanted transmissions in a cellular device implementation. For example, asserting the VCO OFF signal disables current source 212 to disable the VCO 210, and de-asserting the VCO OFF signal activates current source 212 to enable the VCO 210.

When current source 212 is activated, current is applied to tank circuit 220, varactor 230, and cross-coupled transistor pair 240. Tank circuit 220 comprises an inductor 224 and a capacitor bank 222, where capacitor bank 222 is a digitally switchable capacitor bank. When current is applied to tank circuit 220, an LC-resonant circuit is formed by the combination of inductor 224 and capacitor bank 222. The combination of the LC-resonant circuit and the varactor 230 determines an oscillation frequency of VCO 210 (ignoring other non-ideal effects such as parasitic capacitances). Digital tuning control 270 is used to select which capacitors are applied to the tank circuit 220, which allows the system to control the operating frequency of the VCO.

When current is applied to cross-coupled transistor pair 240, feedback is established by coupling the gate of each transistor to the drain of the opposing transistor. The output of cross-coupled transistor pair 240 is coupled to the input of PLL 260 and the inputs of output buffer 250.

As mentioned above, output buffer 250 can be selectively enabled/disabled using the signal OUTPUT BUFFER OFF. In operation, output buffer 250 is typically disabled when VCO 210 is turned on from a quiescent state (e.g., a standby mode for the VCO). The VCO can be turned on before a transmission is desired such that sufficient time is given for the VCO reach a stable operating frequency. To minimize power consumption during this transient time, the settling time of the PLL is minimized.

The output buffer 250 can be disabled during the pre-transmission time required for the VCO to become active and the PLL 260 to exert a stabilizing control. After VCO 210 stabilizes, output buffer 250 can be enabled for transmitting.

However, changes in operating characteristics due to the enabling and disabling of the output buffer 250 can affect the frequency stability of VCO 210. For example, the enabling and disabling of the output buffer 250 affects the voltage supply level, the impedance of the inputs of output buffer 250 (especially when the output buffer is directly coupled to the inputs of the reactive components), and operating temperature.

These non-ideal effects and others, singly and in combination, affect the frequency stability of the VCO and often impose a lengthened settling time for the VCO. For example, a voltage change in the varactor tuning signal of 100 millivolts can cause a frequency change of 2 megahertz. The input impedance of the output buffer 250 can change depending on the state of the output buffer from inactive to activate. Since the input impedance of the output buffer 250 is a load on the VCO 210, a change in the input impedance of the output buffer 250 can change the resonant frequency of the tank circuit 220 because of the changing capacitance of the inputs.

Typically, the described non-ideal effects change the frequency of the VCO 210 by a similar amount (in magnitude and direction) each time the output buffer 250 is activated. The amount can be estimated (or measured) and the effective capacitance of the digital switchable capacitors bank can be changed (e.g., pre-compensated) when activating the output buffer 250. Changing the effective capacitance value of the capacitor bank while the power output buffer 250 is being activated can assist the VCO in maintaining a stable operating frequency, which in turn helps the PLL 260 to settle more quickly (or maintain the frequency lock).

In FIG. 2, the OUTPUT BUFFER OFF signal is coupled to digital tuning control 270. When the digital tuning control 270 senses that the output buffer 250 is being turned on, the digital tuning control 270 changes the value of the capacitor bank to compensate for the transient initialization effects of the output buffer 250).

After the output buffer 250 has been "warmed up," the initialization effects are substantially reduced. (The initialization effects are substantially reduced when the initialization effects no longer affect the settling time of the VCO.) With the initialization effects being substantially reduced, the digital tuning control 270 can change the value of the capacitor bank 222 with values that are better suited for helping the VCO settle while remaining activated with a powered-up output buffer 250.

In another example the digital tuning control 270 is combined with control logic. The control logic can be discrete logic, a controller (that is tasked with duties such as activating/deactivating system components and handling timing and drive considerations of such control signals), or a combination of both.

The control logic can operate in response to (and/or generate) the signal OUTPUT BUFFFER OFF. Accordingly, the control logic in the digital tuning control 270 can change the value of the capacitor bank 222 at substantially the same time it is determined that the output buffer 250 is to be turned on. The digital tuning control 270 can also be combined with the logic that drives the signal VCO OFF (see FIG. 3, for example).

In yet another example, both the VCO 210 and output buffer 250 can be activated at the same (or substantially the same) time. As describe above, activating the output buffer 250 adversely affects the settling time of the VCO 210. When the VCO 210 and output buffer 250 are activated at the same time, the settling time is often made even longer due to combined effects such as a greater change in the operating voltage. The change in the operating voltage (and other effects) is usually greater when both the VCO 210 and output buffer 250 are being activated at the same time.

Figure 3:
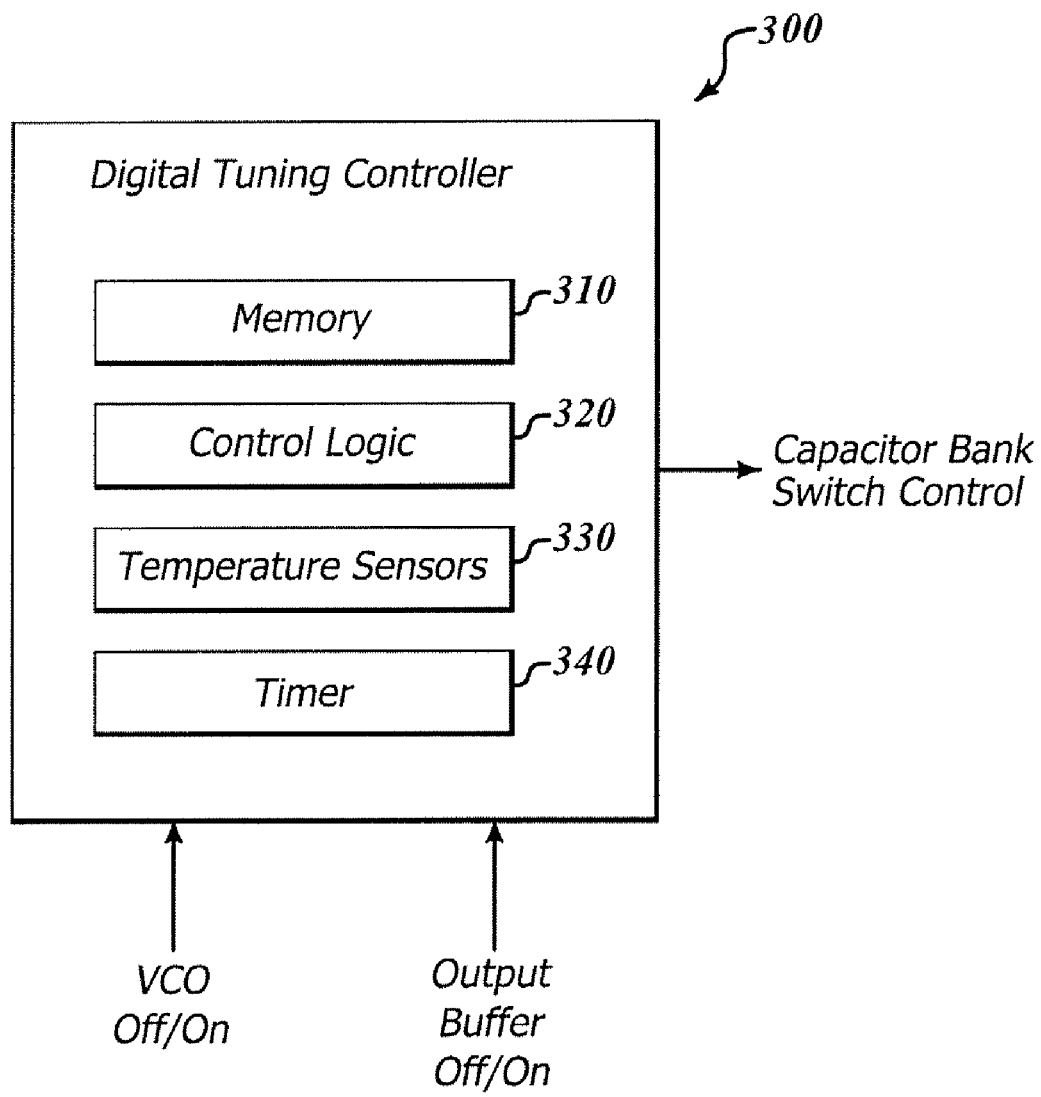
FIG. 3 is a schematic diagram illustrating a digital tuning controller for pre-compensating a VCO, arranged according to embodiments of the present disclosure.

FIG. 3 is a schematic diagram illustrating a digital tuning controller 300 for pre-compensating a VCO, arranged according to embodiments of the present disclosure. Digital tuning controller 300 comprises a memory 310, control logic 320, one or more temperature sensors 330, and a timer 340. Digital tuning controller 300 typically operates in response to a VCO OFF or VCO ON signal and an OUTPUT BUFFER OFF or OUTPUT BUFFER ON signal, and arranged to provide a set of values for the capacitor bank switch control signal. The capacitor bank switch control signal is used to change the capacitance of the capacitor bank (see 222 in FIG. 2) in response to the determination of the digital tuning controller 300.

Memory 310 can be used to hold predetermined values for the capacitor bank 222 and/or values for the capacitor bank 222 that are dynamically calculated (in response to events, for example). For example, when digital tuning controller 300 receives (or determines) a VCO ON condition, a first set of values stored in memory 310 can be used to program the capacitor bank 222. When digital tuning controller 300 receives (or determines) a BUFFER ON condition, a second set of values stored in memory 310 can be used to program the capacitor bank.

Timer 340 can be used in conjunction with other events (such as VCO ON and BUFFER ON) to signal programming the capacitor bank with new values. For example, When the VCO ON and the BUFFER ON signals are received (or determined) before a time period expires in which the VCO would settle, the second set of values can be used to program the capacitor bank, followed by a third set after the time period has passed. The timer 340 and control logic 320 can be configured such that the values can be dynamically calculated (and loaded in the capacitor bank 222) in response to the timer 320. Thus capacitive settings in the bank 222 can be "ramped" based on time. The effective capacitance of the capacitor bank 222 can thus be dynamically adjusted in response to a capacitor program signal.

Temperature Sensor 330 can be used in conjunction with other events (such as VCO ON and BUFFER ON and/or time intervals) to load (and/or calculate) the capacitor bank 222 with new values For example, as the VCO 210 (and/or the output buffer 250) warm up, the natural resonant frequency of the tank circuit 220 can predictably change. As certain changes in temperature are measured by the sensor 330, the capacitive values can be changed in response. The temperature can also be measure in accordance with predetermined time intervals.

Procedure

The following discussion describes procedures that may be realized utilizing the previously described implementations herein. The procedures are illustrated as a collection of blocks in a logical flow graph, which represent a sequence of operations that can be implemented in hardware, software, or a combination thereof. In the context of software, the blocks represent computer-executable instructions that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the process. In portions of the following discussion, reference may be made to the illustrations of FIGS. 1-2 and the subject matter thereof.

Figure 4:
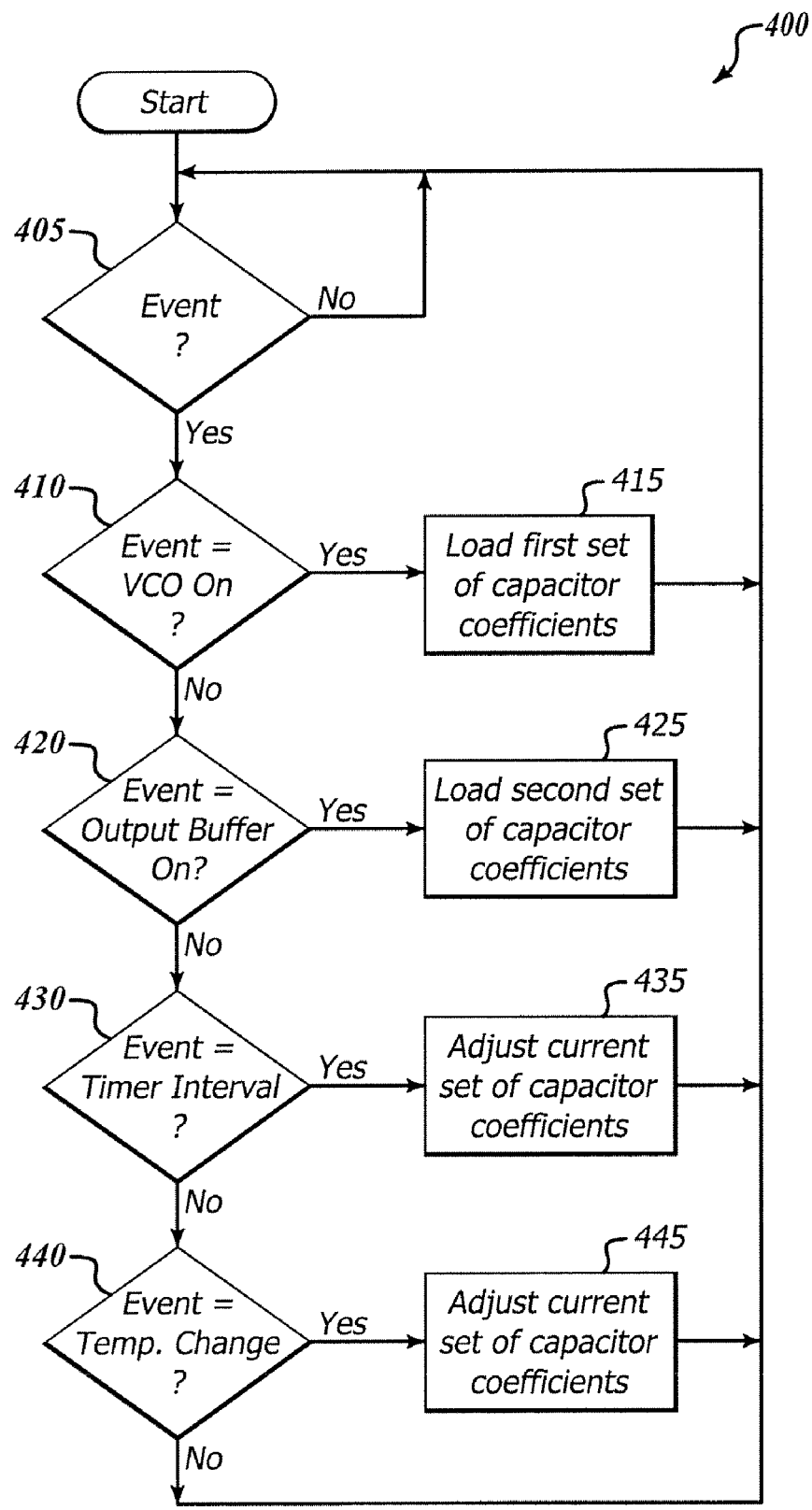
FIG. 4 is a process flow diagram that illustrates a number of operations associated with a control process and/or mechanism for embodiments of an improved VCO arranged according to the present disclosure.

FIG. 4 is a process flow diagram 400 that illustrates a number of operations associated with a control process and/or mechanism for embodiments of an improved VCO arranged according to the present disclosure. Processing for process flow diagram 400 begins at block 405.

At block 405, the process waits until an event is encountered.

At block 410, the VCO ON event is determined and processing continues in block 415. In block 415, the programmable tuning circuit 270 is programmed with a first set of parameters in response to a decision to apply power to the output buffer. The first set of parameters can be calculated to help the VCO 210 settle as quickly as possible under the condition that the output buffer has not been activated.

At block 420, the OUTPUT BUFFER ON event is determined and processing continues in block 425. In block 425, the programmable tuning circuit 270 is programmed with a second set of parameters in response to a decision to apply power to the output buffer 250. The second set of parameters can be calculated to help the VCO 210 settle as quickly as possible under the condition that the output buffer has been activated.

At block 430, the TIMER INTERVAL event is determined and processing continues in block 435. In block 435, the programmable tuning circuit 270 is programmed with a third set of parameters in response to time expiring after applying power to the VCO 210 and/or the output buffer 250. The third set of parameters can be calculated based on the probability of the VCO settling after a range of time has expired. The third set of parameters can thus be programmed after the transient effects have substantially subsided.

At block 440, the TEMPERATURE CHANGE event is determined and processing continues in block 445. In block 445, the programmable tuning circuit 270 is programmed with a fourth set of parameters in response to temperature changes encountered after applying power to the VCO 210 and/or the output buffer 250. The fourth set of parameters can be calculated based on the probability of the VCO settling after a certain temperature has been reached.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as example forms of implementing the claims.

What is claimed is:

1. A frequency synthesizer, comprising:
an oscillator comprising a programmable tuning circuit;

an output buffer for buffering an output of the oscillator, wherein the output buffer is selectively activated and deactivated in response to a signal for controlling the output buffer; and a tuning control circuit that is configured to program the tuning circuit in response to an OUTPUT BUFFER ON conditions, wherein the tuning control circuit changes a value of the programmable tuning circuit to compensate for the changed frequency characteristics resulting from the output buffer being activated from the quiescent operating state.

2. The frequency synthesizer according to claim 1, wherein the output buffer changes frequency characteristics of the oscillator when the output buffer is activated from a quiescent operating state.

3. The frequency synthesizer according to claim 1, wherein the output buffer control signal is directly coupled to the programmable tuning circuit.

4. The frequency synthesizer according to claim 1, further comprising a varactor that is coupled to the programmable tuning circuit and a phase-lock loop circuit, wherein an input of the phase-locked loop circuit is coupled to an output of the VCO, and wherein an output of the phase-locked loop circuit is coupled to a control terminal of the varactor.

5. The frequency synthesizer according to claim 4, wherein the tuning control circuit is configured to program the tuning circuit when the output buffer control signal enables the output buffer.

6. The frequency synthesizer according to claim 5, wherein the programmable tuning circuit comprises a switched capacitor bank.

7. A frequency synthesizer, comprising:
an output buffer circuit that is selectively activated and deactivated in response to a signal for controlling the output buffer; and
an oscillator circuit comprising:
  a cross-coupled transistor pair including a first transistor and a second transistor, each transistor having a drain and a gate, wherein a gate of each transistor is coupled to the drain of the other transistor, wherein at least one drain is coupled to an input of the output buffer;
  a first tuning circuit that is coupled between a source of the first transistor and a source of the second transistor and that comprises an LC-circuit that is controlled by a switched capacitor bank that is configured to change from a first capacitance to a second capacitance in response to the output buffer being activated by the output buffer control signal; and
  a second tuning circuit that is coupled between the source of the first transistor and the source of the second transistor and that comprises a control terminal that is coupled to the output of a phase-lock loop (PLL) that is coupled between the source of the first transistor and the source of the second transistor.

8. The frequency synthesizer according to claim 7, wherein the output buffer and the oscillator are formed on the same substrate.

9. The frequency synthesizer according to claim 7, wherein the difference between the first and second capacitances approximates a change in capacitances for reducing the settling time of the PLL in response to an activation of the output buffer.

10. The frequency synthesizer according to claim 9, wherein the first tuning circuit is configured to change to a third capacitance that is different from the second capacitance in response to a change in temperature.

11. The frequency synthesizer according to claim 7, further comprising a first current source that is coupled to the source of the first transistor and a second current source that is coupled to the source of the second transistor, wherein the first and second current sources are selectively activated.

12. The frequency synthesizer according to claim 7, further comprising a digital tuning control for specifying the first and second capacitances.

13. The frequency synthesizer according to claim 7, wherein the output buffer receives a differential signal from the oscillator.

14. The frequency synthesizer according to claim 7, wherein the output buffer outputs a differential signal.

15. A method, comprising:
applying power to a voltage controlled oscillator (VCO) that comprises a programmable tuning circuit for establishing an oscillation frequency of the VCO;
applying power to an output buffer that has an input that is coupled to an output of the VCO, whereby the applying power to the output buffer causes transient effects on the oscillation frequency of the VCO;
programming the programmable tuning circuit with a first set of parameters in response to a decision to apply power to the VCO;
programming the programmable tuning circuit with a second set of parameters in response to a decision to apply power to the output buffer.

16. The method according to claim 15, further comprising programming the programmable tuning circuit with a third set of parameters after a time period for settling has expired.

17. The method according to claim 16, further comprising programming the programmable tuning circuit with a fourth set of parameters in response to a change in temperature.

18. The method according to claim 16, further comprising applying a ramping set of parameters to the programmable tuning circuit in response to the expiration of periodic time intervals.

19. The method according to claim 18, further comprising coupling an input of the phase-lock loop (PLL) to the output of the VCO and the output of the PLL to a control terminal of a varactor, whereby the PLL provides a fine tuning control for the VCO.

* * * * *